US009640271B2

(12) United States Patent
Pan et al.

(10) Patent No.: US 9,640,271 B2
(45) Date of Patent: May 2, 2017

(54) LOW-DROPOUT REGULATOR PEAK CURRENT CONTROL

(71) Applicant: MICRON TECHNOLOGY, INC., Boise, ID (US)

(72) Inventors: Feng Pan, Fremont, CA (US); Xiaojiang Guo, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 48 days.

(21) Appl. No.: 14/564,821

(22) Filed: Dec. 9, 2014

(65) Prior Publication Data

US 2016/0163396 A1    Jun. 9, 2016

(51) Int. Cl.
*G11C 7/00* (2006.01)
*G11C 16/30* (2006.01)
*G11C 5/14* (2006.01)

(52) U.S. Cl.
CPC ............. *G11C 16/30* (2013.01); *G11C 5/14* (2013.01)

(58) Field of Classification Search
None
See application file for complete search history.

(56) References Cited

U.S. PATENT DOCUMENTS

| 7,274,180 | B2 * | 9/2007 | Itoh | G05F 1/575 323/268 |
| 2014/0159683 | A1 * | 6/2014 | Pan | G05F 1/575 323/280 |
| 2015/0102856 | A1 * | 4/2015 | Barrett, Jr. | G05F 3/30 327/539 |

* cited by examiner

*Primary Examiner* — Kretelia Graham
(74) *Attorney, Agent, or Firm* — Dicke, Billig & Czaja, PLLC

(57) ABSTRACT

A low-dropout regulator includes an error amplifier to provide a control signal, a first transistor, and a second transistor. The first transistor receives the control signal and has a source-drain path electrically coupled between a supply voltage node and a load, the first transistor to power the load in response to a voltage on the supply voltage node rising above an absolute value of a threshold voltage of the first transistor. The second transistor has a source-drain path electrically coupled between the supply voltage node and the load, the second transistor to receive the control signal in response to the voltage on the supply voltage node rising above a particular voltage.

21 Claims, 6 Drawing Sheets

US 9,640,271 B2

LOW-DROPOUT REGULATOR PEAK CURRENT CONTROL

TECHNICAL FIELD

The present disclosure relates generally to peak current control, in particular, in one or more embodiments, the present disclosure relates to peak current control during power-up of a memory device.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, solid state drives and removable memory modules, and the uses are growing.

Power integrity is often an important consideration in the design and usage of memory devices. During power-up of a memory device, a capacitive load is connected to the power supply that generally results in a peak current.

For the reasons stated above, and for other reasons stated below which will become apparent to those skilled in the art upon reading and understanding the present specification, there is a need in the art for alternative methods for controlling peak current, and apparatus to perform such methods.

DETAILED DESCRIPTION

Figure 1A:
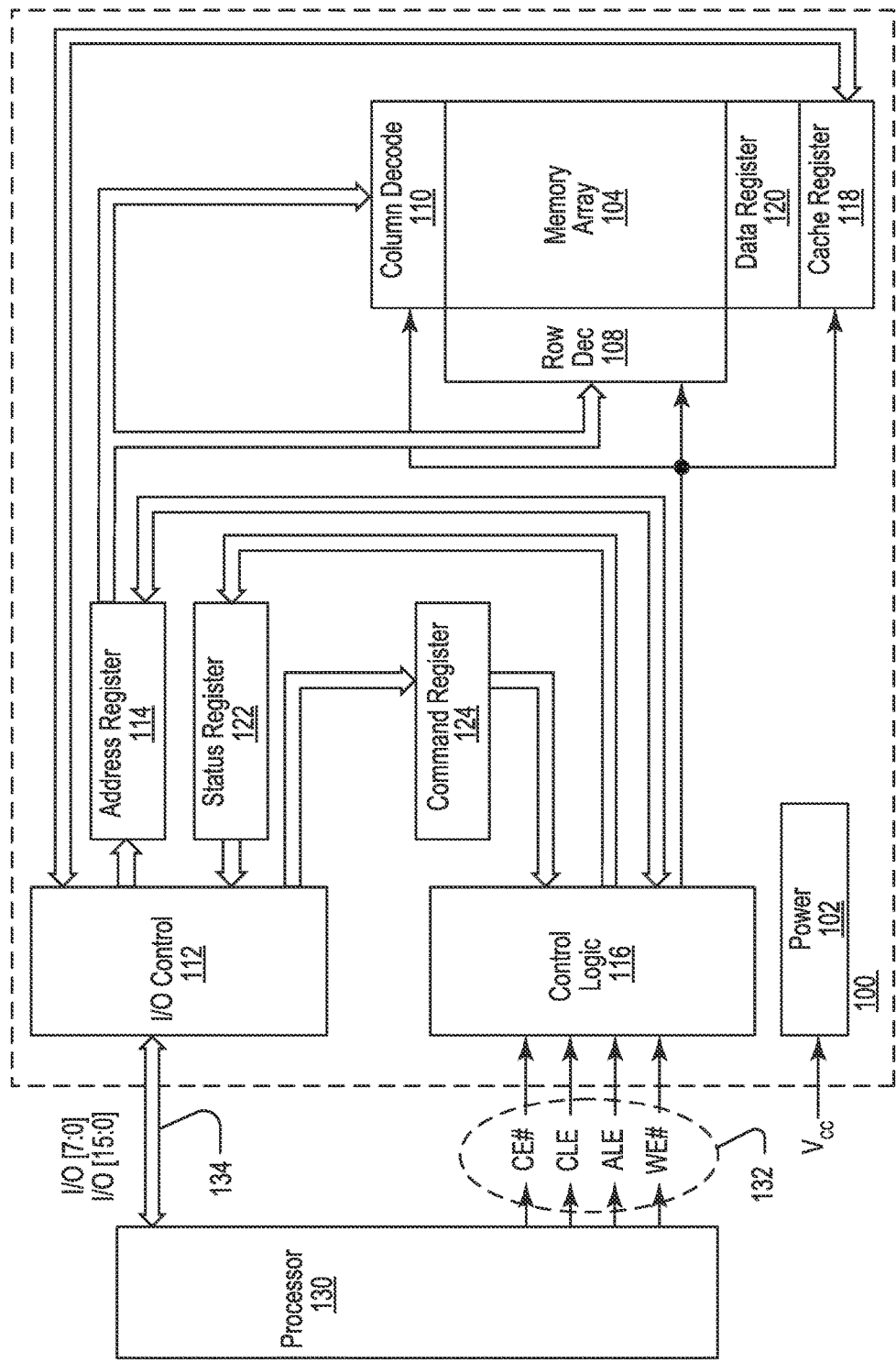
FIG. 1A is a simplified block diagram of one embodiment of a memory device in communication with a processor as part of an electronic system.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

When an external power supply is applied to an apparatus, e.g., a memory device, a capacitive load is connected to the external power supply, which may result in a peak current during power-up to charge the capacitive load. The greater the number of dies in the memory device, the higher the peak current, generally. The peak current may also rise as the die size and/or the density of the memory cells of a memory device increases. Accordingly, this disclosure describes embodiments for controlling peak current during power-up of an apparatus, such as a multi-die memory device.

FIG. 1A is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes power circuitry 102. Power circuitry 102 may include a low-dropout regulator (LDO) that receives a supply voltage, e.g., Vcc, and provides a regulated voltage for powering memory device 100. The LDO limits the peak current during power-up of memory device 100 and provides sufficient current for operating memory device 100 once memory device 100 is powered up. In one example, the supply voltage Vcc is 3.3 volts or another suitable voltage.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1A) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1A has been simplified. It should be recognized that the functionality of the various block components described with reference to FIG. 1A may not necessarily be segregated to distinct components or component portions of an integrated circuit device. For example, a single component or component portion of an integrated circuit device could be adapted to perform the functionality of more than one block component of FIG. 1A. Alternatively, one or more components or component portions of an integrated circuit device could be combined to perform the functionality of a single block component of FIG. 1A.

Additionally, while specific I/O pins are described in accordance with popular conventions for receipt and output of the various signals, it is noted that other combinations or numbers of I/O pins may be used in the various embodiments.

Figure 1B:
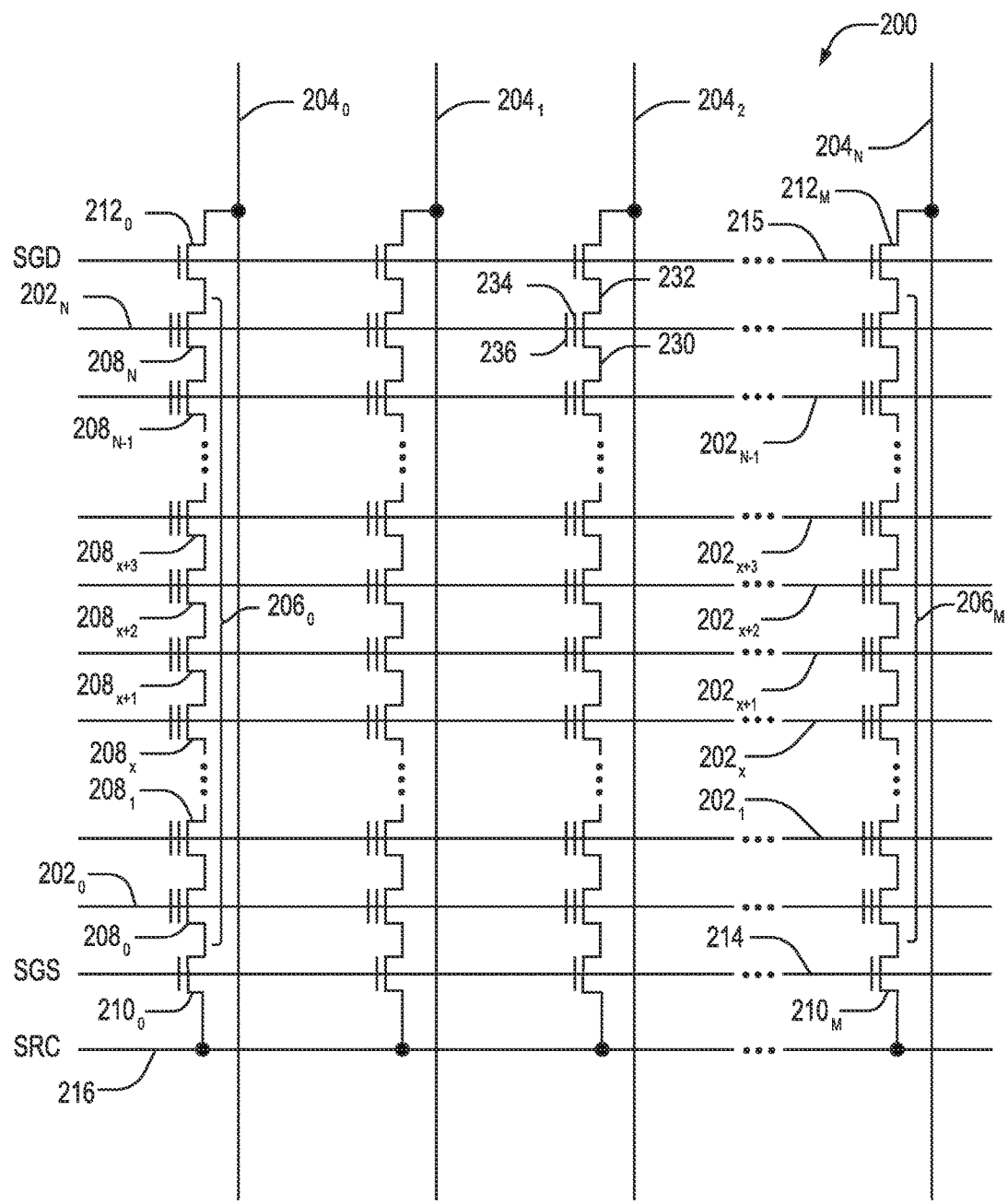
FIG. 1B is a schematic of a portion of an array of memory cells as could be used in a memory device of the type described with reference to FIG. 1A.

FIG. 1B is a schematic of a NAND memory array 200, e.g., as a portion of array of memory cells 104. Memory array 200 includes access lines, such as word lines $202_0$ to $202_N$, and data lines, such as bit lines $204_0$ to $204_M$. The word lines 202 may be coupled to global access lines (e.g., global word lines), not shown in FIG. 1B, in a many-to-one relationship. For some embodiments, memory array 200 may be formed over a semiconductor that, for example, may be conductively doped to have a conductivity type, such as a p-type conductivity, e.g., to form a p-well, or an n-type conductivity, e.g., to form an n-well.

Memory array 200 might be arranged in rows (each corresponding to a word line 202) and columns (each corresponding to a bit line 204). Each column may include a string of series-coupled memory cells, such as one of NAND strings $206_0$ to $206_M$. Each NAND string 206 might be coupled to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly coupled to a select line 214, such as a source select line, and select transistors $212_0$ to $212_M$ might be commonly coupled to a select line 215, such as a drain select line.

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively couple a corresponding NAND string 206 to a corresponding bit line 204. A control gate of each select transistor 212 might be connected to select line 215.

The memory array in FIG. 1B might be a quasi-two-dimensional memory array and might have a generally planar structure, e.g., where the common source 216, strings 206 and bit lines 204 extend in substantially parallel planes. Alternatively, the memory array in FIG. 1B might be a three-dimensional memory array, e.g., where strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data value of the cell (e.g., through changes in threshold voltage), and a control gate 236, as shown in FIG. 1B. Memory cells 208 may further have a defined source 230 and a defined drain 232. Memory cells 208 have their control gates 236 coupled to (and in some cases form) a word line 202.

A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 1B, it is apparent from the figure that the bit lines 204 of the array of memory cells 200 may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Although the example of FIG. 1B is discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

Figure 2:
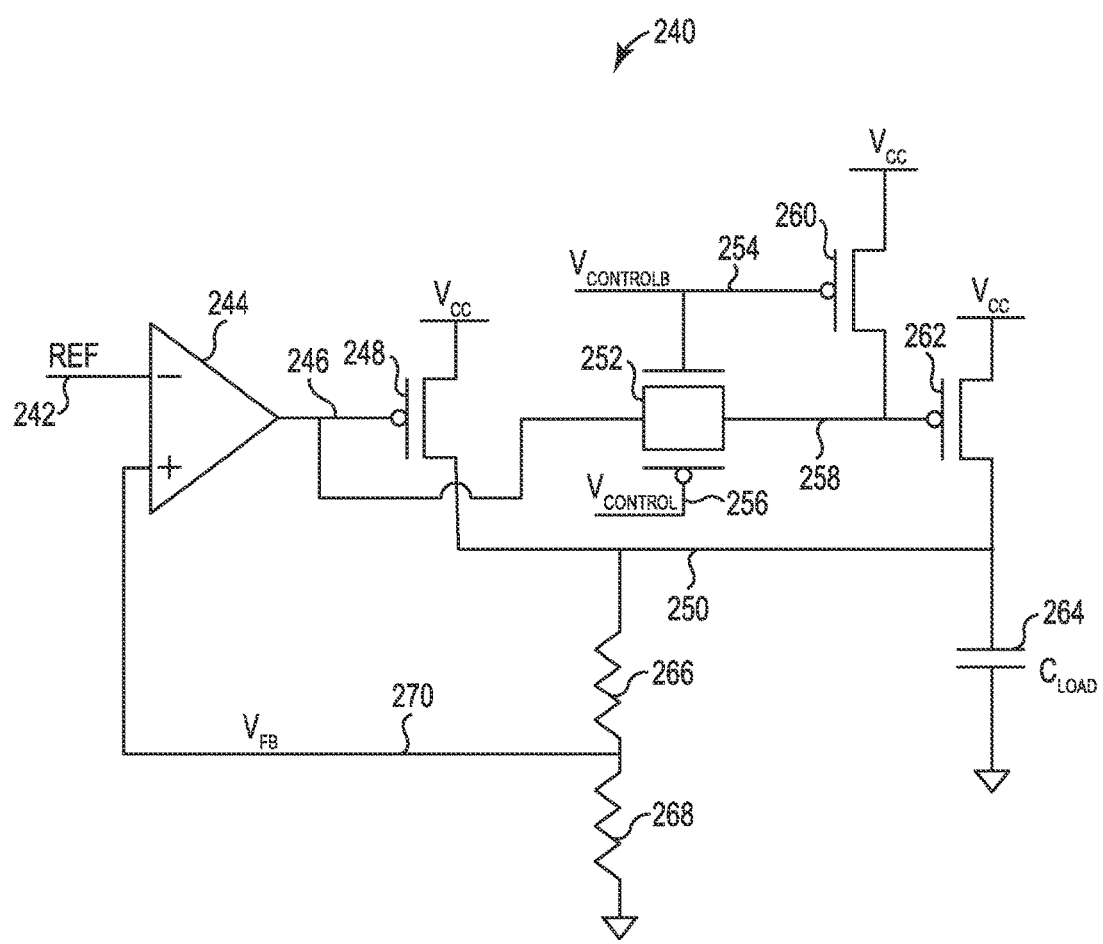
FIG. 2 is a schematic of one embodiment of a low drop out regulator (LDO) for controlling peak current during power-up of a memory device.

FIG. 2 is a schematic of one embodiment of a LDO 240 for controlling peak current during power-up of a memory device, such as memory device 100 previously described and illustrated with reference to FIGS. 1A-1B. In one example, LDO 240 is part of power circuitry 102. LDO 240 may include an error amplifier 244, transistors 248, 260, and 262 (e.g., p-channel field-effect transistors (pFET)), a transmission gate 252, resistors 266 and 268, and a capacitive load $C_{load}$ 264. In one example, capacitive load $C_{load}$ 264 represents the capacitive load of memory device 100 including array of memory cells 104. In other examples, capacitive load $C_{load}$ 264 may represent a multi-die memory device. Resistors 266 and 268 may be discrete resistors or parasitic resistances.

The inverting input of error amplifier 244 receives a reference voltage Ref through a signal path 242. The non-inverting input of error amplifier 244 receives a feedback voltage $V_{FB}$ through a signal path 270. The output of error amplifier 244 is electrically coupled to the gate of transistor 248 and one side of the transmission path of transmission gate 252 through a signal path 246. One side of the source-drain path of each transistor 248, 260, and 262 is electrically coupled to a supply voltage node for providing a supply voltage Vcc. The other side of the source-drain path of transistor 248 is electrically coupled to one side of resistor 266, the other side of the source-drain path of transistor 262, and one side of capacitive load $C_{load}$ 264 through a signal path 250. The other side of resistor 266 is electrically coupled to one side of resistor 268 through $V_{FB}$ signal path 270. The other side of resistor 268 and the other side of capacitive load $C_{load}$ 264 are electrically coupled to a common reference (e.g., ground). The other side of the transmission path of transmission gate 252 is electrically coupled to the other side of the source-drain path of transistor 260 and the gate of transistor 262 through a signal path 258. The gate of the pFET transistor of transmission gate 252 receives a control signal $V_{control}$ through a signal path 256, and the gate of the n-channel field-effect (nFET) transistor of transmission gate 252 and the gate of transistor 260 receive an inverted control signal $V_{controlb}$ through a signal path 254.

Error amplifier 244 receives the reference voltage Ref and the feedback voltage $V_{FB}$ to provide a control signal to control transistor 248. The control signal also controls transistor 262 when transmission gate 252 is turned on (i.e., conducting). Transmission gate 252 selectively passes the control signal from error amplifier 244 to the gate of transistor 262 based on the $V_{control}$ and $V_{controlb}$ signals. The feedback voltage $V_{FB}$ is based on the voltage divider provided by resistors 266 and 268. The reference voltage Ref and resistors 266 and 268 may be selected to maintain a desired regulated voltage on signal path 250. In one example, reference voltage Ref is provided by a bandgap voltage reference.

During power-up, transistor 248 is turned on (i.e., conducting) in response to a voltage (e.g., supply voltage Vcc) on the supply voltage node rising above the absolute value (abs) of the threshold voltage ($V_{tp}$) of transistor 248. As used herein, "in response to" could be, for example, once, after, upon, etc. In one example, the abs($V_{tp}$) equals 0.9 volts. With transistor 248 turned on, capacitive load $C_{load}$ 264 is powered by the supply voltage Vcc through transistor 248. Initially during power-up, the $V_{control}$ signal is logic high and the $V_{controlb}$ signal is logic low such that transmission gate 252 is turned off (i.e., not conducting) and transistor 260 is turned on to keep transistor 262 turned off (i.e., not conducting). In this way, the peak current supplied to capacitive load $C_{load}$ 264 is based on the equivalent resistance ($R_{eq}$) of transistor 248. The peak current is equal to abs($V_{tp}$)/$R_{eq}$. Therefore, the peak current during power-up may be controlled by setting the equivalent resistance of transistor 248.

In response to the voltage (e.g., supply voltage Vcc) on the supply voltage node rising above a particular (e.g., a desired minimum) voltage (e.g., 2.1 volts), the $V_{control}$ signal transitions to logic low and the $V_{controlb}$ signal transitions to logic high. In response to a logic low $V_{control}$ signal and a logic high $V_{controlb}$ signal, transmission gate 252 turns on to pass the control signal output by error amplifier 244 to the gate of transistor 262 and transistor 260 turns off. Thus, in response to the voltage on the supply voltage node rising above the particular voltage, both transistor 248 and transistor 262 are controlled by the output of error amplifier 244 to power capacitive load $C_{load}$ 264 from the supply voltage Vcc. The equivalent resistance of transistor 262 may be set such that a sufficient current (e.g., a current sufficient for normal operation) is provided to capacitive load $C_{load}$ 264 from the combination of transistor 248 and transistor 262 in response to the voltage on the supply voltage node rising above the particular voltage (e.g., once power-up of the memory device is complete).

Figure 3:
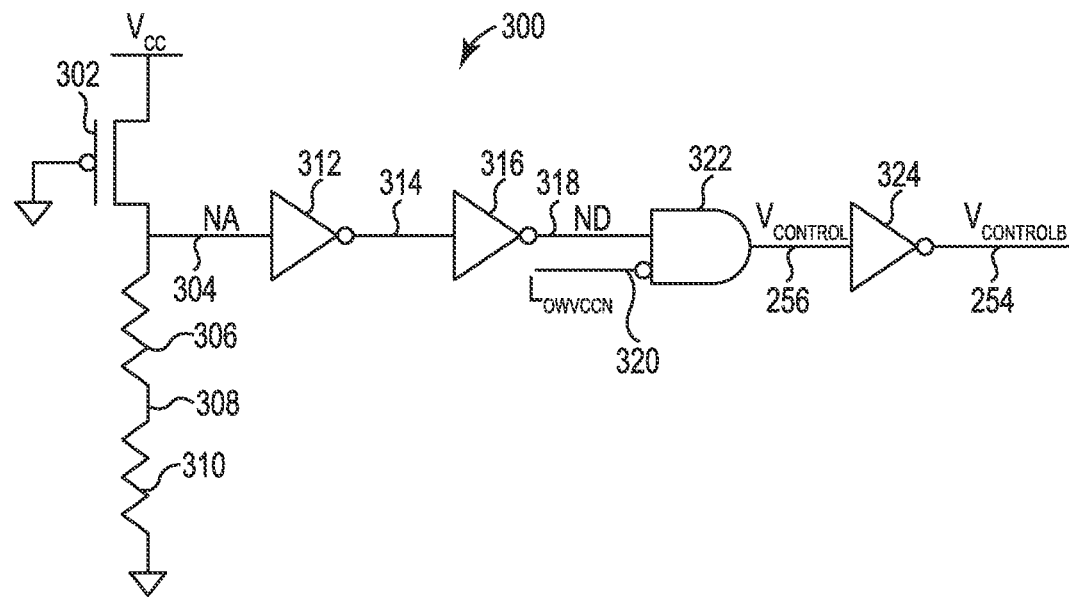
FIG. 3 is a schematic of one embodiment of a power-on reset (POR) detection circuit.

FIG. 3 is a schematic of one embodiment of a power-on reset (POR) detection circuit 300. POR detection circuit 300 may include a transistor 302 (e.g., a pFET transistor), resistors 306 and 310, inverters 312, 316, and 324, and an AND logic gate 322. Resistors 306 and 310 may be discrete resistors or parasitic resistances. One side of the source-drain path of transistor 302 is electrically coupled to a supply voltage node for providing a supply voltage, e.g., Vcc. The gate of transistor 302 is electrically coupled to a common reference (e.g., ground). The other side of the source-drain path of transistor 302 is electrically coupled to the input of inverter 312 and one side of resistor 306 through NA signal path 304. The other side of resistor 306 is electrically coupled to one side of resistor 310 through a signal path 308. The other side of resistor 310 is electrically coupled to the common reference.

The output of inverter 312 is electrically coupled to the input of inverter 316 through a signal path 314. The output of inverter 316 is electrically coupled to one input of AND logic gate 322 through ND signal path 318. An inverting input of AND logic gate 322 receives the Lowvccn signal through signal path 320. The output of AND logic gate 322 is electrically coupled to the input of inverter 324 through $V_{control}$ signal path 256. The output of inverter 324 provides the $V_{controlb}$ signal on signal path 254. The $V_{control}$ and $V_{controlb}$ signals control transmission gate 252 previously described and illustrated with reference to FIG. 2.

Inverter 312 inverts the NA signal to provide an inverted NA signal. Inverter 316 inverts the inverted NA signal to provide the ND signal. AND logic gate 322 receives the ND signal and the Lowvccn signal to provide the $V_{control}$ signal. In response to a logic low ND signal or a logic high Lowvccn signal, AND logic gate 322 provides a logic low $V_{control}$ signal. In response to a logic high ND signal and a logic low Lowvccn signal, AND logic gate 322 provides a logic high $V_{control}$ signal. Inverter 324 inverts the $V_{control}$ signal to provide the $V_{controlb}$ signal.

Upon power-up, transistor 302 turns on in response to a voltage (e.g., supply voltage Vcc) on the supply voltage node rising above the absolute value of the threshold voltage of transistor 302. In response to transistor 302 turning on, the NA signal transitions to logic high. Accordingly, the ND signal also transitions to logic high. Initially in response to power-up, the Lowvccn signal is logic low. Thus, the $V_{control}$ signal is logic high and the $V_{controlb}$ signal is logic low once the NA signal is logic high. In response to the voltage on the supply voltage node rising above a particular (e.g., a desired minimum) voltage, the Lowvccn signal transitions to logic high. Thus, the $V_{control}$ signal transitions to logic low and the $V_{controlb}$ signal transitions to logic high.

Figure 4:
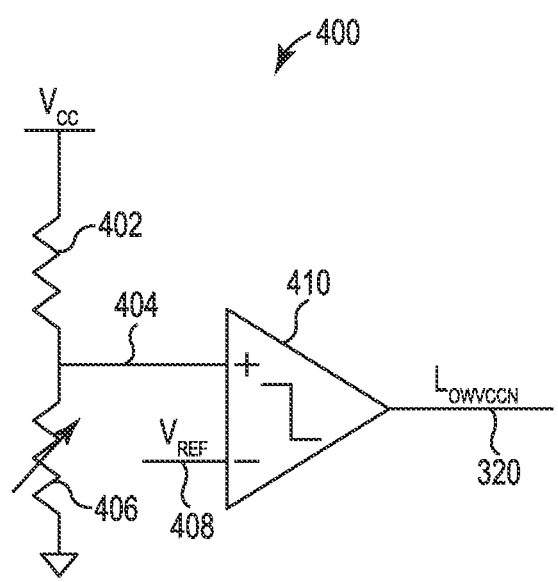
FIG. 4 is a schematic of one embodiment of a circuit for detecting whether a supply voltage is greater than a particular voltage.

FIG. 4 is a schematic of one embodiment of a circuit 400 for detecting whether the supply voltage Vcc is greater than a particular (e.g., a desired minimum) voltage. Circuit 400 may include resistors 402 and 406 and an amplifier 410. Resistors 402 and 406 may be discrete resistors or parasitic resistances. One side of resistor 402 is electrically coupled to a supply voltage node for providing a supply voltage, e.g., Vcc. The other side of resistor 402 is electrically coupled to the non-inverting input of amplifier 410 and one side of resistor 406 through a signal path 404. The other side of resistor 406 is electrically coupled to a common reference (e.g., ground). The inverting input of amplifier 410 receives a reference voltage vref on a signal path 408. In one example, reference voltage vref is provided by a bandgap voltage reference. The output of amplifier 410 provides the Lowvccn signal on signal path 320. The Lowvccn signal is an input to AND logic gate 322 as previously described and illustrated with reference to FIG. 3.

Resistors 402 and 406 provide a voltage divider for dividing the supply voltage Vcc to set the voltage applied to the non-inverting input of amplifier 410. Resistor 406 may be a variable resistor for setting the desired voltage applied to the non-inverting input of amplifier 410. Upon power-up, in response to a voltage on the supply voltage node rising above a particular voltage as set by reference voltage vref and the voltage divider, amplifier 410 outputs a logic high Lowvccn signal. In one example, the Lowvccn signal transitions to logic high once the supply voltage Vcc rises above 2.1 volts.

Figure 5:
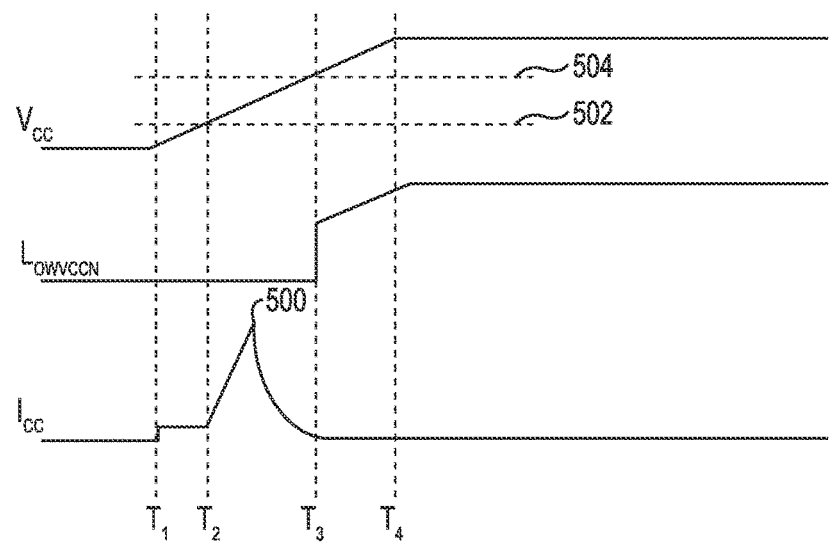
FIG. 5 is a timing diagram illustrating one example of signals of a memory device during power-up without peak current control.

FIG. 5 is a timing diagram illustrating one example of signals of a memory device as might occur during power-up without peak current control (i.e., a LDO including a single transistor controlled by an error amplifier for supplying power to the load). The timing diagram includes the supply voltage Vcc, the Lowvccn signal, and the supply current Icc. At time $t_1$ the supply voltage Vcc is turned on and begins to rise. In response to the supply voltage rising above a threshold voltage of the transistor as indicated at 502 at time $t_2$, the transistor turns on and supplies current to the load. The load draws a peak current as indicated at 500 between time $t_2$ and time $t_3$ as the supply voltage Vcc continues to rise above the threshold voltage. At time $t_3$, the supply voltage Vcc reaches a desired minimum voltage indicated at 504 and the Lowvccn signal transitions to logic high. Once the supply voltage Vcc reaches the desired minimum voltage at time $t_3$, the supply current Icc is within the operating range for the memory device. Between time $t_3$ and time $t_4$, the supply voltage Vcc continues to rise until the supply voltage Vcc reaches its set voltage. The Lowvccn signal also rises between time $t_3$ and time $t_4$ as the supply voltage Vcc rises, since the Lowvccn signal is dependent upon the supply voltage Vcc. The amplitude and duration of the peak current is dependent upon the equivalent resistance of the transistor and the resistor-capacitor (RC) network time constant of the load. If not controlled, the peak current may damage the memory device.

Figure 6:
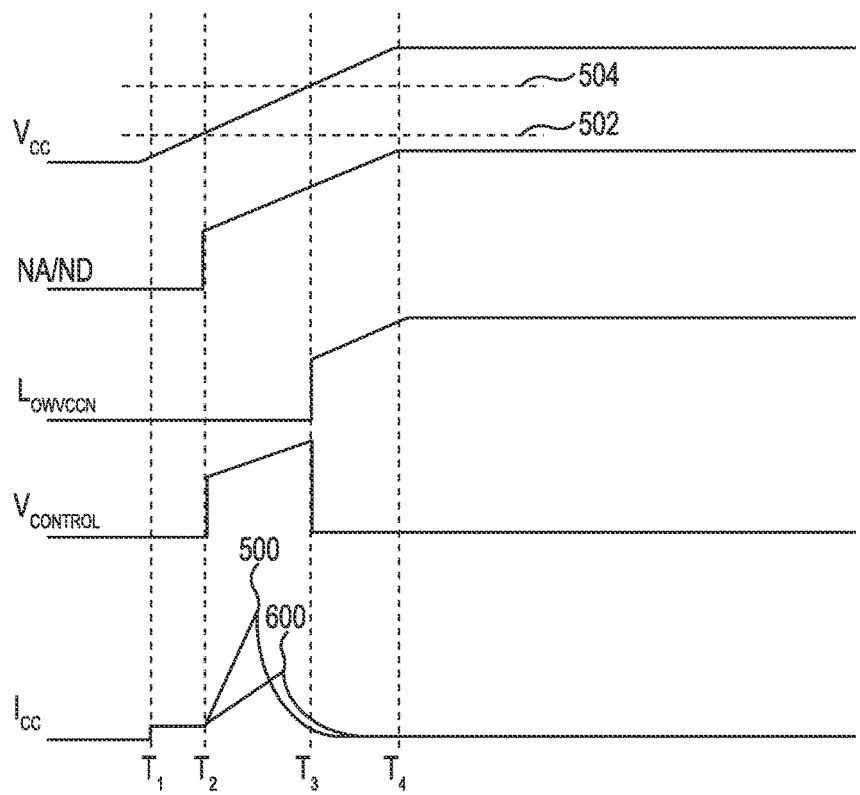
FIG. 6 is a timing diagram illustrating one example of signals of a memory device during power-up with peak current control.

FIG. 6 is a timing diagram illustrating one example of signals of a memory device as might occur during power-up with peak current control. The timing diagram includes the supply voltage Vcc, the NA and ND signals, the Lowvccn signal, the $V_{control}$ signal, and the supply current Icc. At time $t_1$ the supply voltage Vcc is turned on and begins to rise. In response to the supply voltage Vcc rising above a threshold voltage of transistor 248 (FIG. 2) as indicated at 502 at time $t_2$, transistor 248 turns on and supplies current to the capacitive load $C_{load}$ 264. Also at time $t_2$, transistor 302 (FIG. 3) turns on such that the NA and ND signals transition to logic high. In response to the logic high ND signal, the $V_{control}$ signal transitions to logic high.

The capacitive load $C_{load}$ 264 draws a peak current indicated at 600 between time t2 and time t3 as the supply voltage Vcc continues to rise above the threshold voltage. The peak current at 600 is limited by the equivalent resistance of transistor 248 such that the peak current at 600 may be less than the peak current indicated at 500 for a LDO without peak current control. Between time $t_2$ and time $t_3$, the NA, ND, and $V_{control}$ signals rise as the supply voltage Vcc rises, since the NA, ND, and $V_{control}$ signals are dependent upon the supply voltage Vcc. At time $t_3$, the supply voltage Vcc reaches a desired minimum voltage indicated at 504 and the Lowvccn signal transitions to logic high. In response to the Lowvccn signal transitioning to logic high, the $V_{control}$ signal transitions to logic low.

With the $V_{control}$ signal logic low, transistor 262 (FIG. 2) turns on to supply current to the capacitive load $C_{load}$ 264 in addition to the current supplied by transistor 248. Once the supply voltage Vcc reaches the desired minimum voltage at time $t_3$, the supply current Icc is within the operating range for the memory device. Between time $t_3$ and time $t_4$, the supply voltage Vcc continues to rise until the supply voltage Vcc reaches its set voltage. The Lowvccn signal also rises between time $t_3$ and time $t_4$ as the supply voltage Vcc rises, since the Lowvccn signal is dependent upon the supply voltage Vcc. The amplitude and duration of the peak current is dependent upon the equivalent resistance of transistor 248 and the RC network time constant for the load. Therefore, by setting the equivalent resistance of transistor 248, the peak current can be controlled during power-up.

Figure 7:
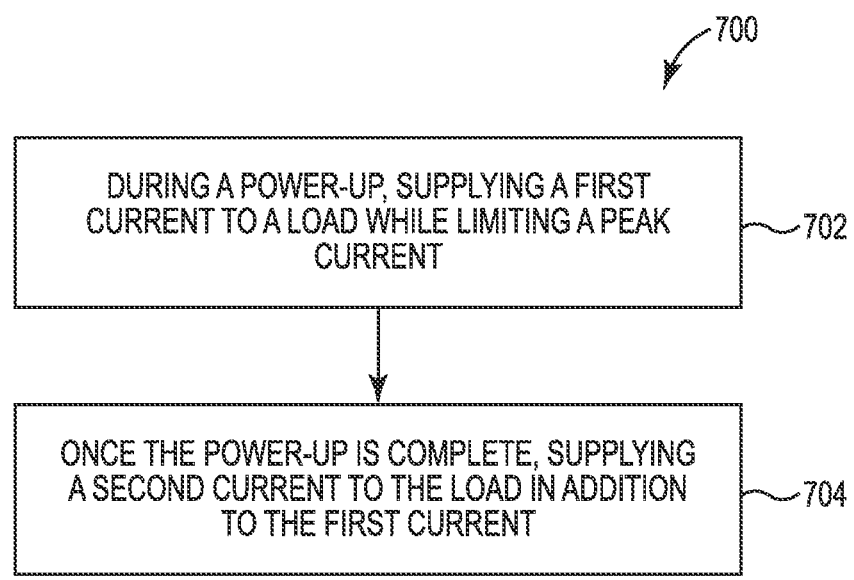
FIG. 7 is a flow diagram illustrating one example of a method for operating a memory device.

FIG. 7 is a flow diagram illustrating one example of a method 700 for operating a memory device, such as memory device 100 previously described and illustrated with reference to FIGS. 1A-1B. At 702, during a power-up, a first current is supplied to a load while limiting a peak current. At 704, once the power-up is complete, a second current is supplied to the load in addition to the first current. In one example, a power-up of a memory device is defined as occurring between time $t_1$ and time $t_3$ such that the power-up is complete at time $t_3$ as illustrated in FIG. 6. In one example, a supply voltage is monitored during the power-up and the second current is supplied in response to the supply voltage rising above a particular (e.g., a desired minimum) voltage. Monitoring the supply voltage may include voltage dividing the supply voltage to provide a first voltage and comparing the first voltage to a reference voltage. A regulated voltage may be supplied to the load. In one example, the load may be a multi-die memory device.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A low-dropout regulator comprising:
   an error amplifier to provide a control signal;
   a first transistor to receive the control signal and having a source-drain path electrically coupled between a supply voltage node and a load, the first transistor to power the load in response to a voltage on the supply voltage node rising above an absolute value of a threshold voltage of the first transistor;
   a second transistor having a source-drain path electrically coupled between the supply voltage node and the load, the second transistor to receive the control signal in response to the voltage on the supply voltage node rising above a particular voltage; and
   a third transistor having a source-drain path electrically coupled between the supply voltage node and a gate of the second transistor.

2. The low-dropout regulator of claim 1, further comprising:
   a transmission gate to pass the control signal to the second transistor in response to the voltage on the supply voltage node rising above the particular voltage.

3. The low-dropout regulator of claim 2, further comprising:
   a power-on reset detection circuit to provide a signal to turn on the transmission gate in response to the voltage on the supply voltage node rising above the particular voltage.

4. The low-dropout regulator of claim 1, wherein an equivalent resistance of the first transistor is set to limit a peak current during power-up.

5. The low-dropout regulator of claim 1, wherein an equivalent resistance of the second transistor is set such that a particular current is supplied to the load in response to the voltage on the supply voltage node rising above the particular voltage.

6. The low-dropout regulator of claim 1, wherein the first transistor comprises a first p-channel field-effect transistor, and
   wherein the second transistor comprises a second p-channel field-effect transistor.

7. A system comprising:
   an error amplifier to provide a control signal based on a reference voltage and a feedback voltage;
   a first transistor having a gate to receive the control signal and having a source-drain path electrically coupled between a supply voltage node and a load, the first transistor to power the load in response to a voltage on the supply voltage node rising above an absolute value of a threshold voltage of the first transistor;
   a second transistor having a source-drain path electrically coupled between the supply voltage node and the load;
   a third transistor having a source-drain path electrically coupled between the supply voltage node and a gate of the second transistor; and
   a transmission gate electrically coupled between the error amplifier and the second transistor, the transmission gate to selectively pass the control signal,
   wherein the transmission gate passes the control signal to the gate of the second transistor in response to the voltage on the supply voltage node rising above a particular voltage.

8. The system of claim 7, further comprising:
   a power-on reset detection circuit to turn on the transmission gate and turn off the third transistor in response to the voltage on the supply voltage node rising above the particular voltage.

9. The system of claim 8, wherein the power-on reset detection circuit comprises:
   a transistor which turns on in response to the voltage on the supply voltage node rising above an absolute value of a threshold voltage of the transistor to provide a first signal;
   two inverters in series to receive the first signal and provide a second signal;
   a logic gate to provide a fourth signal in response to the second signal and a third signal indicating the voltage on the supply voltage node is above the particular voltage; and
   an inverter to invert the fourth signal to provide a fifth signal,
   wherein the fourth signal and the fifth signal control the transmission gate, and
   wherein the fifth signal controls the third transistor.

10. The system of claim 7, wherein the first transistor comprises a first p-channel field-effect transistor having an equivalent resistance set to limit a peak current supplied to the load prior to the voltage on the supply voltage node rising above the particular voltage.

11. A memory device comprising:
a power-on reset detection circuit to provide a control signal in response to a supply voltage rising above a particular voltage;
an array of memory cells; and
a low-dropout regulator to supply power to the array of memory cells and having a first transistor and a second transistor, the low-dropout regulator to limit a peak current to the array of memory cells through the first transistor during a power-up of the memory device prior to receiving the control signal, and to supply current to the array of memory cells through the first transistor and the second transistor in response to receiving the control signal,
wherein the power-on reset detection circuit comprises a transistor to provide a first signal in response to the supply voltage rising above an absolute value of the threshold voltage of the transistor and a logic circuit to provide the control signal in response to the first signal and a second signal indicating the supply voltage is above the particular voltage.

12. The memory device of claim 11, wherein an equivalent resistance of the first transistor is set to limit the peak current during power-up.

13. The memory device of claim 11, wherein the low-dropout regulator comprises an error amplifier to control the first transistor and the second transistor and a transmission gate between the error amplifier and the second transistor, the transmission gate controlled by the control signal.

14. The memory device of claim 11, wherein the array of memory cells comprises a three-dimensional memory array.

15. A method for limiting peak current during power-up, the method comprising:
turning on a first transistor to supply a first current from a supply voltage to a load while limiting a peak current based on an equivalent resistance of the first transistor;
turning on a second transistor to supply a second current to the load from the supply voltage in addition to the first current in response to the supply voltage rising above a particular voltage less than the supply voltage's set voltage;
turning on a third transistor to keep the second transistor turned off with the supply voltage below the particular voltage; and
turning off the third transistor in response to the supply voltage rising above the particular voltage.

16. The method of claim 15, further comprising:
providing a control signal to the first transistor to turn on the first transistor in response to power-up of the supply voltage;
blocking the control signal from the second transistor to keep the second transistor turned off until the supply voltage rises above the particular voltage; and
passing the control signal to the second transistor to turn on the second transistor in response to the supply voltage rising above the particular voltage.

17. The method of claim 15, further comprising:
monitoring the supply voltage during the power-up.

18. The method of claim 17, wherein monitoring the supply voltage comprises voltage dividing the supply voltage to provide a first voltage and comparing the first voltage to a reference voltage.

19. The method of claim 15, further comprising:
regulating a voltage supplied to the load.

20. The method of claim 15, wherein supplying the first current to the load comprises supplying the first current to a multi-die memory device.

21. The method of claim 15, wherein the supply voltage continues to rise after power-up is complete until the supply voltage reaches the supply voltage's set voltage.

* * * * *